United States Patent
Kim et al.

(10) Patent No.: US 12,473,660 B2
(45) Date of Patent: Nov. 18, 2025

(54) METHOD OF PREPARING SINGLE CRYSTAL PEROVSKITE AND METHOD OF MANUFACTURING SOLAR CELL USING SINGLE CRYSTAL PEROVSKITE

(71) Applicant: KOREA ELECTRIC POWER CORPORATION, Naju-si (KR)

(72) Inventors: Do Hyung Kim, Daejeon (KR); Hyun Shil Kim, Daejeon (KR); Jae Seob Yoo, Daejeon (KR); Yu Jin Kang, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 84 days.

(21) Appl. No.: 17/983,179

(22) Filed: Nov. 8, 2022

(65) Prior Publication Data
US 2023/0357956 A1  Nov. 9, 2023

(30) Foreign Application Priority Data

May 9, 2022 (KR) .......................... 10-2022-0056793

(51) Int. Cl.
*C30B 29/22* (2006.01)
*C30B 19/10* (2006.01)
(Continued)

(52) U.S. Cl.
CPC ............ *C30B 29/22* (2013.01); *C30B 19/106* (2013.01); *H10K 30/10* (2023.02); *H10K 71/164* (2023.02);
(Continued)

(58) Field of Classification Search
CPC .............. Y02E 10/549; H10K 2102/00; H10K 30/10; H10K 30/40; H10K 71/12; H10K 71/164;
(Continued)

(56) References Cited

U.S. PATENT DOCUMENTS

2017/0350002 A1* 12/2017 Yamazaki .............. C01G 9/006
2018/0217561 A1*  8/2018 Isshiki ................ G04G 9/0088
2018/0233296 A1*  8/2018 Yan ..................... C23C 16/4481
(Continued)

FOREIGN PATENT DOCUMENTS

CN         114420852 A    4/2022
EP          3223323 A1    9/2017
(Continued)

OTHER PUBLICATIONS

Guo et. al., "A Generalized Crystallization Protocol for Scalable Deposition of High-Quality Perovskite Thin Films for Photovoltaic Applications," Adv. Sci. 2019, 6, 1901067 (Year: 2019).*
(Continued)

*Primary Examiner* — Hua Qi
(74) *Attorney, Agent, or Firm* — Benest Law Office PC

(57) ABSTRACT

A method of forming single crystal perovskite according to an exemplary embodiment of the present invention includes: forming a preliminary thin film by applying a perovskite precursor solution containing an additive on a substrate; exposing the preliminary thin film to a vacuum state by transferring the preliminary thin film to a vacuum chamber; and switching an internal pressure of the vacuum chamber to an atmospheric pressure, wherein the additive includes a substituted or unsubstituted C1 to C30 aliphatic ammonium salt, a substituted or unsubstituted C6 to C30 aromatic ammonium salt, a substituted or unsubstituted C1 to C30 aliphatic amine salt, a substituted or unsubstituted C6 to C30 aromatic amine salt, or a combination thereof.

5 Claims, 13 Drawing Sheets

(51) Int. Cl.
  *H10K 30/10* (2023.01)
  *H10K 71/16* (2023.01)
  *H10K 85/30* (2023.01)
  *H10K 102/00* (2023.01)
(52) U.S. Cl.
  CPC ....... *H10K 85/341* (2023.02); *H10K 2102/00* (2023.02)
(58) Field of Classification Search
  CPC .... H10K 71/811; H10K 85/341; H10K 85/50; C30B 19/106; C30B 29/22
  See application file for complete search history.

(56) References Cited

U.S. PATENT DOCUMENTS

| | | | |
|---|---|---|---|
| 2020/0055882 A1* | 2/2020 | Luther | C07F 7/24 |
| 2020/0157125 A1 | 5/2020 | Irwin et al. | |
| 2020/0294727 A1* | 9/2020 | Segawa | H01G 9/2059 |
| 2021/0159426 A1* | 5/2021 | Huang | H10K 30/81 |

FOREIGN PATENT DOCUMENTS

| | | |
|---|---|---|
| JP | 3669860 B2 | 4/2005 |
| JP | 2012-220712 A | 11/2012 |
| JP | 2016-149472 A | 8/2016 |
| JP | 2022-507895 A | 1/2022 |
| KR | 10-2000-0035021 A | 6/2000 |
| KR | 10-2018-0122706 A | 11/2018 |
| KR | 10-1967666 B1 | 4/2019 |
| KR | 10-2020-0046916 A | 5/2020 |
| KR | 10-2164284 B1 | 10/2020 |
| KR | 10-2021-0132536 A | 11/2021 |
| KR | 10-2022-0032802 A | 3/2022 |
| KR | 10-2022-0051624 A | 4/2022 |
| WO | 2019138154 A1 | 7/2019 |

OTHER PUBLICATIONS

Fei Guo, et al., A Generalized Crystallization Protocol for Scalable Deposition of High-Quality Perovskite Thin Films for Photovoltaic Applications, advancedsdence, 2019, pp. 1-12, vol. 6.

Guanghui Yu, et al., Vacuum-Assisted Thermal Annealing of CsPbI3 for Highly Stable and Efficient Inorganic Perovskite Solar Cells, Angew. Chem. Int. Ed, 2022, vol. 61.

A communication of office Action of European Patent Application No. 22212454.7, issued on Oct. 4, 2023, which corresponds to this application.

* cited by examiner

METHOD OF PREPARING SINGLE CRYSTAL PEROVSKITE AND METHOD OF MANUFACTURING SOLAR CELL USING SINGLE CRYSTAL PEROVSKITE

CROSS-REFERENCE TO RELATED APPLICATION

This application claims priority to and the benefit of Korean Patent Application No. 10-2022-0056793 filed in the Korean Intellectual Property Office on May 9, 2022, the entire contents of which are incorporated herein by reference.

BACKGROUND OF THE INVENTION

(a) Field of the Invention

The present invention relates to a method of preparing single crystal perovskite, and more particularly, to a method of preparing single crystal perovskite used in a solar cell and a method of manufacturing a solar cell using single crystal perovskite.

(b) Description of the Related Art

Recently, an organic-inorganic hybrid perovskite (OIHP) solar cell using a perovskite material ($ABX_3$ having a structure in which A is a monovalent organic/inorganic methylammonium ($CH_3NH_3^+$, $MA^+$) or formamidinium ($HC(NH_2)_2^+$, $FA^+$), B is a divalent metal cation $Pb^{2+}$ or $Sn^{2+}$, and X is a halogen anion $Cl^-$, $Br^-$, or $I^-$) for a photoactive layer has shown a rapid increase in power conversion efficiency (PCE) from 3.8% in 2009 to 25.5% in 2021.

The high photoelectric conversion efficiency of the perovskite-based solar cell is based on excellent photoelectric properties of an organic-inorganic hybrid perovskite photoactive layer such as a high charge carrier mobility, a long intrinsic carrier recombination lifetime, a simply tunable band gap, long electron and hole diffusion lengths, and a high absorption coefficient in visible light range, and the perovskite-based solar cell is attracting considerable attention as a next-generation solar cell to replace a silicon solar cell and an alternative energy source in the future.

However, the solar cell including the perovskite photoactive layer is mainly formed of polycrystalline perovskite that is relatively easily prepared. Such polycrystalline perovskite is relatively less efficient than single crystal perovskite due to a high trap density. In addition, the efficiency of the polycrystalline perovskite solar cell is stagnant recently due to a high density of fundamental structural defects (for example, point defects, grain boundaries, and the like).

In comparison, it is known that a trap density of a single crystal perovskite photoactive layer is tens of times lower than that of a polycrystalline perovskite photoactive layer, such that a diffusion length of carriers is approximately 100 times longer than that of the polycrystalline perovskite photoactive layer. Therefore, the single crystal perovskite photoactive layer may exhibit performance beyond the limit of the polycrystalline perovskite photoactive layer, but a process time in a method of preparing single crystal perovskite according to the related art takes from several hours to a week, and an apparatus for preparing single crystal perovskite is significantly complicated. Therefore, the single crystal perovskite has not been applied to a solar cell.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention has been made in an effort to provide a method of preparing single crystal perovskite and a method of manufacturing a solar cell using single crystal perovskite by solving the problem of a long time required for a method of preparing single crystal perovskite and complexity of an apparatus of preparing single crystal perovskite according to the related art.

Further, the present invention has been made in an effort to provide an environmentally friendly method of preparing single crystal perovskite by eliminating a process using an anti-solvent that is most widely used in the method of preparing perovskite according to the related art.

An exemplary embodiment of the present invention provides a method of forming single crystal perovskite, the method including: forming a preliminary thin film by applying a perovskite precursor solution containing an additive on a substrate; exposing the preliminary thin film to a vacuum state by transferring the preliminary thin film to a vacuum chamber; and switching an internal pressure of the vacuum chamber to an atmospheric pressure, wherein the additive includes a substituted or unsubstituted C1 to C30 aliphatic ammonium salt, a substituted or unsubstituted C6 to C30 aromatic ammonium salt, a substituted or unsubstituted C1 to C30 aliphatic amine salt, a substituted or unsubstituted C6 to C30 aromatic amine salt, or a combination thereof.

The substituted or unsubstituted C1 to C30 aliphatic ammonium salt or the substituted or unsubstituted C6 to C30 aromatic ammonium salt may be any one of 2-chloroethylammonium ($CIEA^+$), ethane-1,2-diammonium ($EDA^{2+}$), 2-(methylthio)-ethylammonium ($MTEA^+$), n-propylammonium (n-$PA^+$), n-butylammonium (n-$BA^+$), iso-butylammonium (i-$BA^+$), tert-butylammonium (t$BA^+$), tetra-butylammonium ($TBA^+$), 5-ammonium valeric acid (5-$AVA^+$), n-hexyl trimethyl ammonium ($HTAB^+$), n-octylammonium (n-$OA^+$), n-dodecylammonium (n-$DA^+$), phenethylammonium ($PEA^+$), pentafluorophenylethylammonium ($FEA^+$), 4-tert-butyl-benzylammonium (t$BBA^+$), 1-napthylmethylammonium ($NMA^+$), and 2-thiophene ethylammonium (2-$TEA^+$).

The substituted or unsubstituted C1 to C30 aliphatic amine salt or the substituted or unsubstituted C6 to C30 aromatic amine salt may be oleylamine ($OAm^+$) or S-benzyl-L-cysteine ($SBLC^+$).

The exposing of the preliminary thin film to the vacuum state may be performed for 1 second to 10 minutes.

A vacuum pressure may be $1^{-1}$ to $3^{-3}$ torr.

In the switching of the internal pressure of the vacuum chamber to the atmospheric pressure, an inert gas may be injected into the vacuum chamber.

The inert gas may be nitrogen or argon.

The inert gas may be injected by being heated at 25° C. to 300° C.

The additive may be injected in an amount of 0.001 wt % to 10 wt % with respect to the amount of the perovskite precursor solution.

The perovskite precursor solution may further contain a passivation additive, and the passivation additive may have at least one functional group of a metal cation ($K^+$ or $Na^+$), —SCN, —CN, —$NH_2$, —$N_3$, —Cl, —Br, —I, —F, —COOH, —POOH, —OH, —CF$_3$, —OCH$_3$, —C=O, —S=O, —SH, —NH, a benzyl group, an alkoxy group, and —CH$_3$.

The passivation additive may be potassium iodide or benzylammonium thiocyanate (BASCN).

Another exemplary embodiment of the present invention provides a method of manufacturing a solar cell, the method including: forming a first electrode on a substrate; forming a hole transport layer on the first electrode; forming a photoactive layer on the hole transport layer; forming an electron transport layer on the photoactive layer; and forming a second electrode on the electron transport layer, wherein the forming of the photoactive layer includes: forming a preliminary thin film by applying a perovskite precursor solution containing an additive on the hole transport layer; exposing the preliminary thin film to a vacuum state by transferring the preliminary thin film to a vacuum chamber; and switching an internal pressure of the vacuum chamber to an atmospheric pressure, and the additive includes a substituted or unsubstituted C1 to C30 aliphatic ammonium salt, a substituted or unsubstituted C6 to C30 aromatic ammonium salt, a substituted or unsubstituted C1 to C30 aliphatic amine salt, a substituted or unsubstituted C6 to C30 aromatic amine salt, or a combination thereof.

The substituted or unsubstituted C1 to C30 aliphatic ammonium salt or the substituted or unsubstituted C6 to C30 aromatic ammonium salt may be any one of 2-chloroethyl-ammonium (CIEA$^+$), ethane-1,2-diammonium (EDA$^{2+}$), 2-(methylthio)-ethylammonium (MTEA$^+$), n-propylammonium (n-PA$^+$), n-butylammonium (n-BA$^+$), iso-butylammonium (i-BA$^+$), tert-butylammonium (tBA$^+$), tetra-butylammonium (TBA$^+$), 5-ammonium valeric acid (5-AVA$^+$), n-hexyl trimethyl ammonium (HTAB$^+$), n-octylammonium (n-OA$^+$), n-dodecylammonium (n-DA$^+$), phenethylammonium (PEA$^+$), pentafluorophenylethylammonium (FEA$^+$), 4-tert-butyl-benzylammonium (tBBA$^+$), 1-napthylmethyl-ammonium (NMA$^+$), and 2-thiophene ethylammonium (2-TEA$^+$).

The substituted or unsubstituted C1 to C30 aliphatic amine salt or the substituted or unsubstituted C6 to C30 aromatic amine salt may be oleylamine (OAm$^+$) or S-benzyl-L-cysteine (SBLC$^+$).

The exposing of the preliminary thin film to the vacuum state may be performed for 1 second to 10 minutes.

In the switching of the internal pressure of the vacuum chamber to the atmospheric pressure, an inert gas may be injected into the vacuum chamber.

The inert gas may be injected by being heated at 25° C. to 300° C. The additive may be injected in an amount of 0.001 wt % to 10 wt % with respect to the amount of the perovskite precursor solution.

The perovskite precursor solution may further contain a passivation additive, and the passivation additive may have at least one functional group of a metal cation (K$^+$ or Na$^+$), —SCN, —CN, —NH$_2$, —N$_3$, —Cl, —Br, —I, —F, —COOH, —POOH, —OH, —CF$_3$, —OCH$_3$, —C=O, —S=O, —SH, —NH, a benzyl group, an alkoxy group, and —CH$_3$.

As set forth above, according to an exemplary embodiment of the present invention, single crystal perovskite may be easily prepared by adding the additive to the perovskite precursor solution and performing the vacuum process. Therefore, the process time may be reduced compared to the method of preparing single crystal perovskite according to the related art, and an apparatus for preparing single crystal perovskite may be simplified to improve productivity.

Further, single crystal perovskite may be prepared without using an anti-solvent, such that it is possible to provide an environmentally friendly method of preparing single crystal perovskite.

Further, the solar cell including single crystal perovskite is manufactured, such that a solar cell having improved efficiency may be provided.

DETAILED DESCRIPTION OF THE EMBODIMENTS

Hereinafter, exemplary embodiments of the present invention will be described in detail with reference to the accompanying drawings so that those skilled in the art may easily practice the present invention. However, the present invention may be implemented in various different forms and is not limited to exemplary embodiments described herein.

In addition, throughout the present specification, unless explicitly described to the contrary, "comprising" any components will be understood to imply the inclusion of other components rather than the exclusion of any other components.

Figure 1:
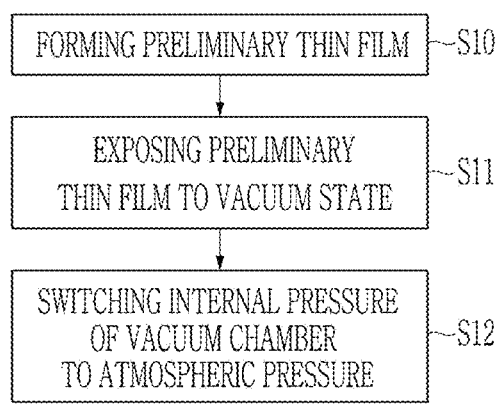
FIG. 1 is a flow chart for describing a method of preparing single crystal perovskite according to an exemplary embodiment of the present invention.

FIG. 1 is a flow chart for describing a method of preparing single crystal perovskite according to an exemplary embodiment of the present invention.

As illustrated in FIG. 1, a method of producing a perovskite thin film according to an exemplary embodiment of the present invention includes: forming a preliminary thin film by applying a perovskite precursor solution containing an alkylamine ligand on a substrate (S10), exposing the preliminary thin film to a vacuum state by transferring the preliminary thin film to a vacuum chamber (S11), and switching an internal pressure of the vacuum chamber to an atmospheric pressure (S12).

In the forming of the preliminary thin film (S10), a perovskite photoactive precursor solution is prepared, an additive is injected into the prepared solution, and stirring is performed for 5 minutes or longer.

The perovskite precursor solution may form $ABX_3$, which is a perovskite structure, in which A may be an organic/inorganic cation (methylammonium ($CH_3NH_3^+$, $MA^+$), formamidinium ($HC(NH_2)_2^+$, $FA^+$), cesium (Cs), rubidium (Rb), or the like), B may be a divalent metal cation ($Pb^{2+}$, $Sn^{2+}$, or the like), and X may be a halogen anion ($Cl^-$, $Br^-$, $I^-$, or the like).

The additive may be added in an amount of 0.001 wt % to 10 wt %, and may include a substituted or unsubstituted C1 to C30 aliphatic ammonium salt, a substituted or unsubstituted C6 to C30 aromatic ammonium salt, a substituted or unsubstituted C1 to C30 aliphatic amine salt, a substituted or unsubstituted C6 to C30 aromatic amine salt, or a combination thereof. For example, substituted or unsubstituted C1 to C30 aliphatic ammonium salt or the substituted or unsubstituted C6 to C30 aromatic ammonium salt may be any one of 2-chloroethylammonium ($CIEA^+$), ethane-1,2-diammonium ($EDA^{2+}$), 2-(methylthio)-ethylammonium ($MTEA^+$), n-propylammonium (n-$PA^+$), n-butylammonium (n-$BA^+$), iso-butylammonium (i-$BA^+$), tert-butylammonium ($tBA^+$), tetra-butylammonium ($TBA^+$), 5-ammonium valeric acid (5-$AVA^+$), n-hexyl trimethyl ammonium ($HTAB^+$), n-octylammonium (n-$OA^+$), n-dodecylammonium (n-$DA^+$), phenethylammonium ($PEA^+$), pentafluorophenylethylammonium ($FEA^+$), 4-tert-butyl-benzylammonium ($tBBA^+$), 1-napthylmethylammonium ($NMA^+$), and 2-thiophene ethylammonium (2-$TEA^+$), and the substituted or unsubstituted C1 to C30 aliphatic amine salt or the substituted or unsubstituted C6 to C30 aromatic amine salt may be oleylamine ($OAm^+$) or S-benzyl-L-cysteine ($SBLC^+$).

The additive may further contain a passivation additive.

The passivation additive may have at least one functional group of a metal cation ($K^+$ or $Na^+$), —SCN, —CN, —$NH_2$, —$N_3$, —Cl, —Br, —I, —F, —COOH, —POOH, —OH, —$CF_3$, —$OCH_3$, —C=O, —S=O, —SH, —NH, a benzyl group, an alkoxy group, and —$CH_3$.

The preliminary thin film may be a wet film formed by a method such as a spin coating method, a slot-die coating method, or an inkjet coating method.

In the exposing of the preliminary thin film to the vacuum state (S11), the preliminary thin film is transferred to the vacuum chamber, and then the preliminary thin film is exposed to a vacuum state in the vacuum chamber for 1 second to 10 minutes.

In the switching of the internal pressure of the vacuum chamber to the atmospheric pressure (S12), the vacuum state of the vacuum chamber is switched to an atmospheric state, and an inert gas such as nitrogen ($N_2$) or argon (Ar) gas is injected to switch the vacuum state of the vacuum chamber to the atmospheric state. As a result, a single crystal perovskite thin film is formed. In this case, the inert gas may be injected into the vacuum chamber in a state of being heated at 25° C. to 300° C.

Comparative Example 1

A perovskite precursor solution was prepared. The perovskite precursor solution was prepared by adding 65.94 mg of CsI, 187.02 mg of FAI, 13.59 mg of FABr, 573 mg of $PbI_2$, and 79.82 mg of $PbBr_2$ were added to 1 ml of a solvent (DMF:DMSO=9:1), and stirring the solution for 3 hours or longer.

Thereafter, 90 ul of the perovskite precursor solution was applied onto a substrate by a spin coating method to form a preliminary thin film. The substrate was a glass substrate, and a size of the substrate was 2.5×2.5 $cm^2$. The spin coating was performed at 500 rpm for 5 seconds and then was performed at 5,000 rpm for 45 seconds.

Thereafter, 30 seconds before the spin coating was completed, 300 ul of an anti-solvent solution CB (chlorobenzene) was applied to a surface of the preliminary thin film.

Then, the spin-coated substrate was subjected to a heat treatment by using a hot plate at 100° C. for 10 minutes to form a perovskite thin film.

Comparative Example 2

A perovskite thin film of Comparative Example 2 was formed in the same manner as that of Comparative Example 1, except that the process of applying CB as an anti-solvent was not performed.

Experimental Example 1

The same precursor solution as in Comparative Example 1 was prepared, 1.4 ul of oleylamine as an additive was added to the prepared precursor solution, and the solution was stirred for 20 minutes or longer, thereby preparing a precursor solution.

Thereafter, the precursor solution was applied onto a substrate by spin coating in the same manner as that of Comparative Example 1 to form a preliminary thin film.

Then, the preliminary thin film was transferred to a vacuum chamber, the inside of the chamber was switched to a vacuum state at 1-1 to 3-3 torr, nitrogen gas heated to 100° C. was injected, and the internal state of the vacuum chamber was switched to an atmospheric state, thereby forming a perovskite thin film.

Experimental Example 2

A perovskite thin film of Experimental Example 2 was formed in the same manner as that of Experimental Example 1, except that 1 mg of octylammonium iodine was added as an additive and stirring was performed for 1 hour or longer.

Comparative Example 3

A perovskite thin film of Comparative Example 3 was formed in the same manner as that of Experimental Example 1, except that the process of applying CB as an anti-solvent was performed.

Figure 2:
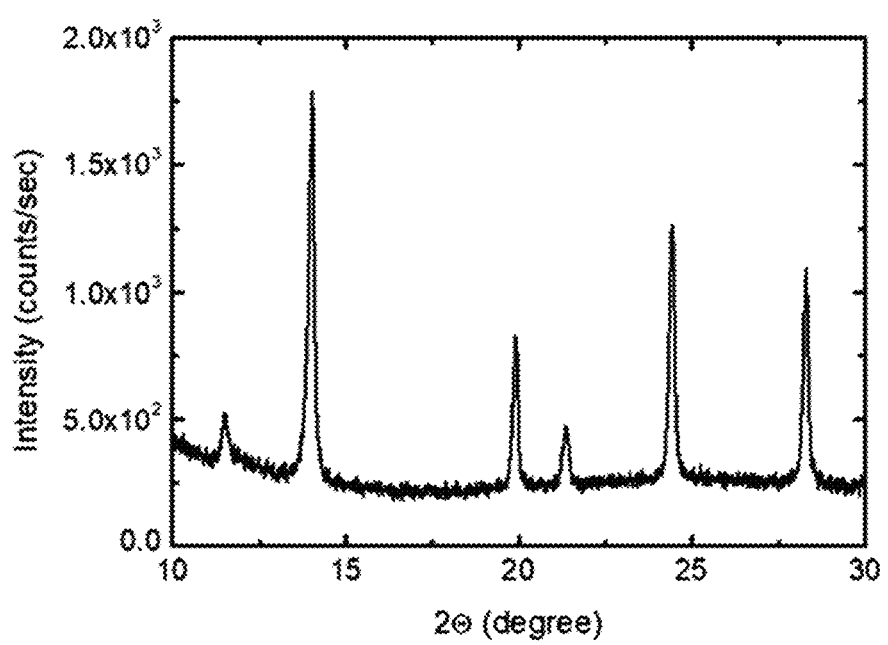
FIG. 2 is X-ray diffraction data of a perovskite thin film according to Comparative Example 1.
Figure 3:
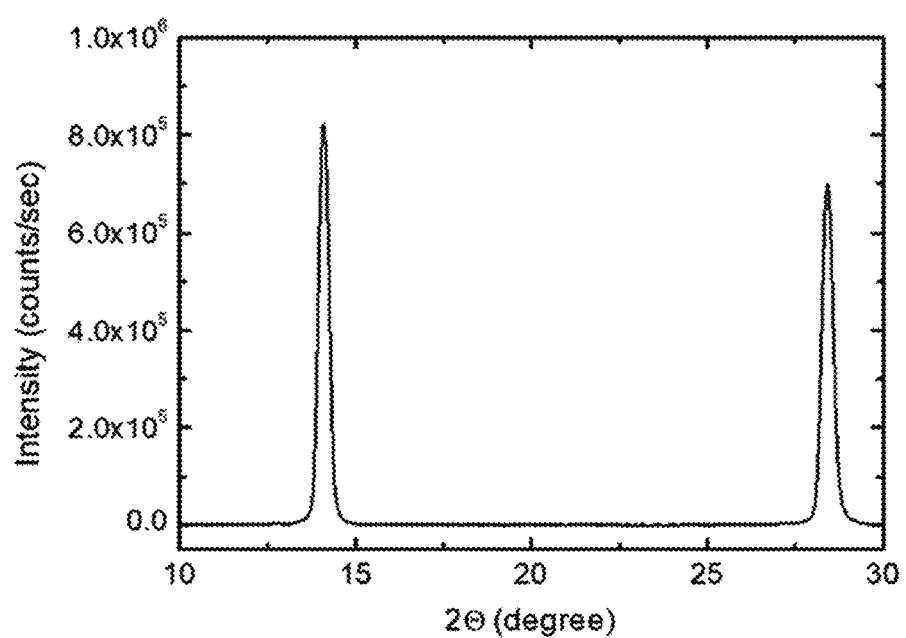
FIGS. 3 and 4 are X-ray diffraction data of perovskite thin films according to Experimental Examples 1 and 2.
Figure 4:
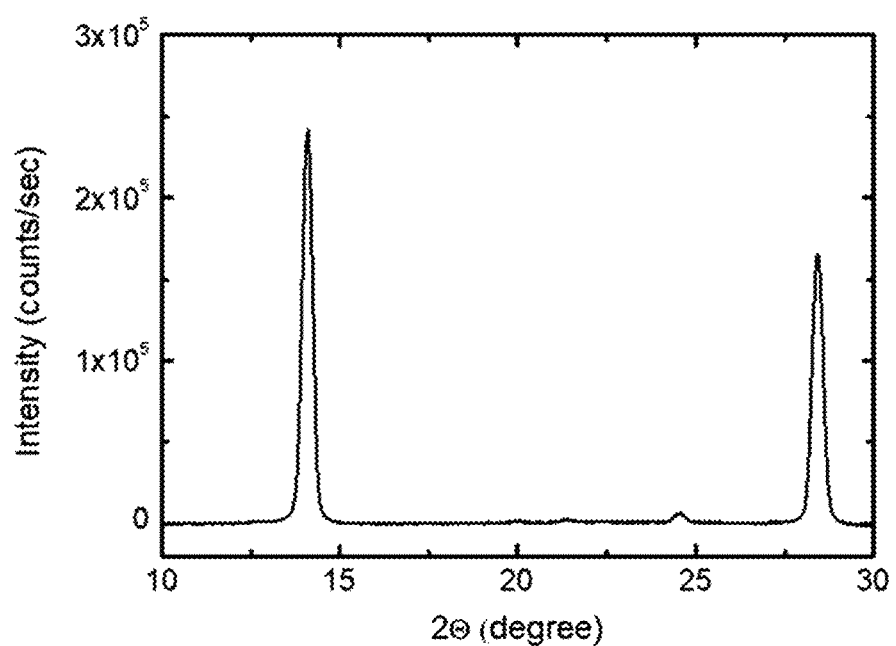

FIG. 2 is X-ray diffraction data of the perovskite thin film according to Comparative Example 1, and FIGS. 3 and 4 are X-ray diffraction data of the perovskite thin films according to Experimental Examples 1 and 2.

Referring to FIG. 2 according to Comparative Example 1 according to the related art, in the perovskite thin film, it could be confirmed that (100), (110), (111), and (200) crystal planes in several directions, that is, polycrystals appeared.

On the other hand, referring to FIGS. 3 and 4 according to Experimental Examples 1 and 2, it could be confirmed that (110) and (111) crystal planes did not appear, and only (100) and (200) single crystal planes in a vertical direction appeared.

Figure 5:
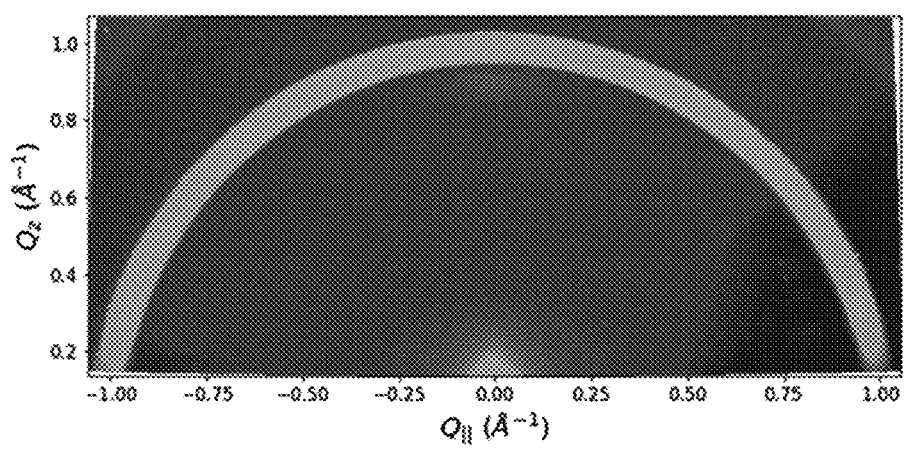
FIGS. 5 and 6 are grazing-incidence wide-angle X-ray scattering (GIWAXS) photographs of the perovskite thin films according to Comparative Example 1 and Experimental Example 1, respectively.
Figure 6:
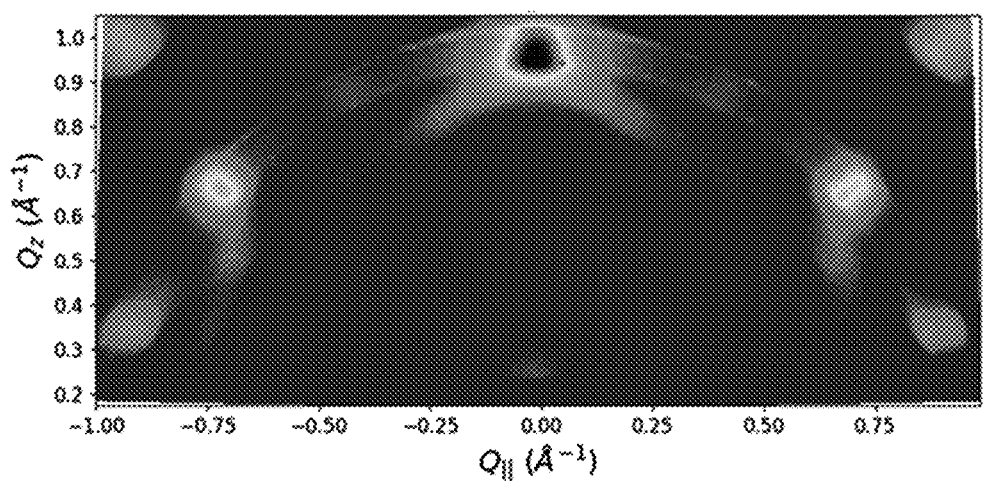

FIGS. 5 and 6 are grazing-incidence wide-angle X-ray scattering (GIWAXS) photographs of the perovskite thin films according to Comparative Example 1 and Experimental Example 1, respectively.

Referring to FIG. 5 according to Comparative Example 1, a ring form, which was a characteristic of a polycrystalline structure, was confirmed in a reciprocal lattice space. On the other hand, referring to FIG. 6 according to Experimental Example 1, a single crystal spot form was confirmed.

Figure 7:
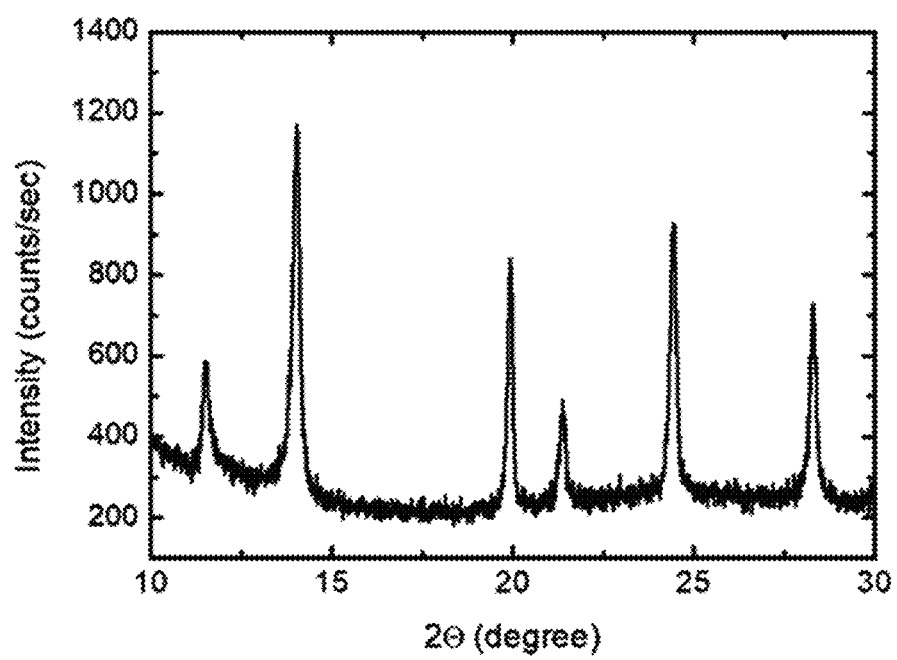
FIGS. 7 and 8 are X-ray diffraction data of perovskite thin films according to Comparative Examples 2 and 3.
Figure 8:
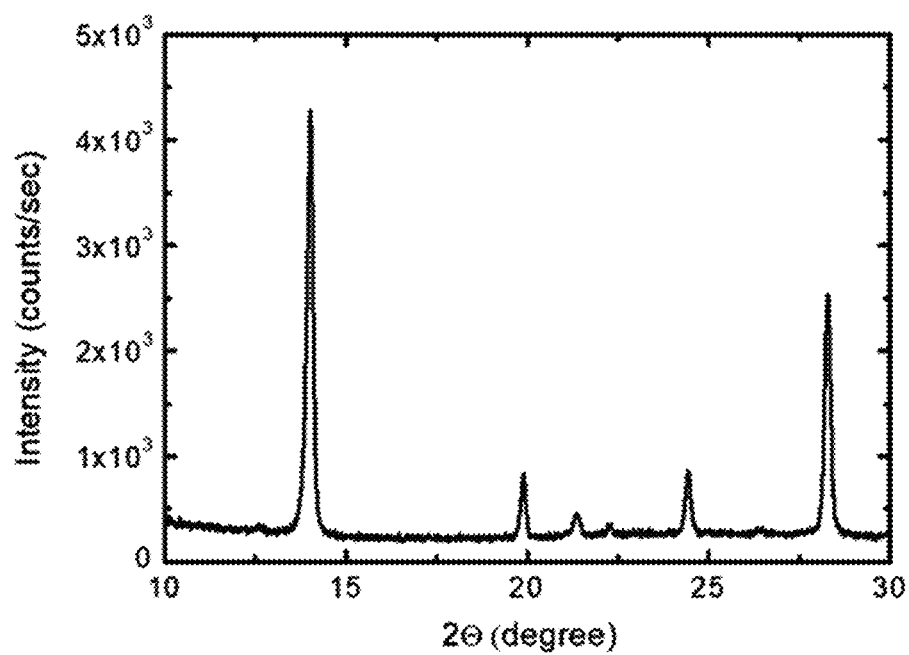

FIGS. 7 and 8 are X-ray diffraction data of the perovskite thin films according to Comparative Examples 2 and 3.

Referring to FIG. 7 according to Comparative Example 2, in the perovskite thin film, it could be confirmed that (100), (110), and (111) crystal planes in several directions, that is, polycrystals appeared.

Unlike Experimental Example 1, in Comparative Example 1, the process of applying the anti-solvent was not performed, oleylamine as an additive was not contained, and it was confirmed that the growth of single crystals was promoted by oleylamine.

Referring to FIG. 8 according to Comparative Example 3, in the perovskite thin film, it could be confirmed that (100), (110), (111), and (200) crystal planes in several directions, that is, polycrystals appeared.

In Comparative Example 3, oleylamine was contained as in Experimental Example 1, whereas a process of applying an anti-solvent was performed, and it could be confirmed that polycrystalline characteristics were exhibited in a case where the process of applying an anti-solvent was performed even when oleylamine was contained.

That is, as in an exemplary embodiment of the present invention, it could be confirmed that a single crystal perovskite thin film was produced only by performing the switching process including a vacuum and heat treatment after coating with a precursor solution containing an additive.

The perovskite thin film may be used as a photoactive layer of a solar cell.

Hereinafter, the solar cell according to an exemplary embodiment of the present invention will be described in detail with reference to the accompanying drawings.

Figure 9:
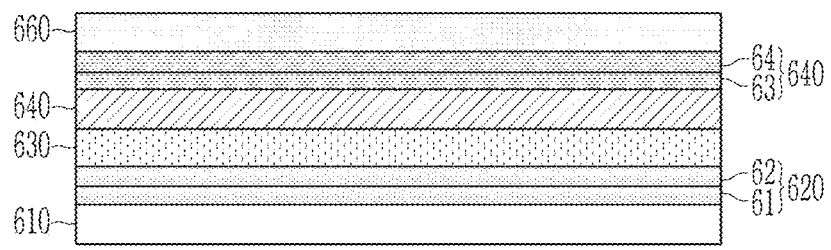
FIG. 9 is a schematic cross-sectional view of a solar cell according to an exemplary embodiment of the present invention.

FIG. 9 is a schematic cross-sectional view of a solar cell according to an exemplary embodiment of the present invention.

Referring to FIG. 9, the solar cell according to an exemplary embodiment of the present invention includes: a substrate 610, a first electrode 620 formed on the substrate 610; a hole transport layer 630 formed on the first electrode 620; a photoactive layer 640 formed on the hole transport layer 630; an electron transport layer 650 formed on the photoactive layer 640; and a second electrode 660 formed on the electron transport layer 650.

The substrate 610 is formed of glass, which is a transparent material, and the first electrode 620 is formed of a transparent material, and may be formed of, for example, indium tin oxide (ITO), indium zinc oxide (IZO), or the like.

The hole transport layer 630 may include a first hole transport layer 61 and a second hole transport layer 62 formed on the first hole transport layer 61. The first hole transport layer 61 may be formed by performing sputtering, thermal evaporation, slot die, spin coating, or the like of NiOx, and the second hole transport layer 62 may be formed by coating any one of MEO-2PACz and PTAA and then performing a heat treatment.

The photoactive layer 640 may be a perovskite thin film formed by a method of producing a single crystal perovskite thin film according to an exemplary embodiment of the present invention.

A passivation layer may be formed on a surface of the photoactive layer 640 for passivation, and may include, for example, any one of LiF, KF, FAI, FABr CsI, CsBr, MAI, MABr, and RbI. The passivation layer may be formed at a thickness of 0.1 nm to 3 nm, and may be formed by a method such as a thermal evaporation method, a spin coating method, a dip coating method, a drop casting method, a slot die coating method, a blade coating method, a meniscus coating method, a gravure printing method, a screen printing method, a spray coating method, a 3D direct ink writing method, or an inkjet printing method.

The electron transport layer 650 may include a first electron transport layer 63 and a second electron transport layer 64, the first electron transport layer 63 may be formed by depositing C60, and the second electron transport layer 64 may be formed by using SnOx at a thickness of 5 nm to 30 nm using an atomic layer deposition reactor. In this case, an operation temperature of the atomic layer deposition reactor is 70° C. to 150° C.

The second electrode 660 may include a transparent electrode formed of ITO or IZO, a metal such as Cu, Ag, or Al, an alloy thereof, or a plurality of layers including the same.

Experimental Example 3

An ITO transparent electrode was deposited on a transparent glass substrate, and NiOx was deposited on the transparent electrode at a thickness of 10 nm by a sputtering method.

Thereafter, a heat treatment was performed at 300° C. for 10 minutes, 90 ul of MEO-2PACz (SAM material) dissolved in ethanol at a concentration of 3 mM was applied onto NiOx, and 10 after seconds, spin coating was performed at 3,000 rpm for 20 seconds. Thereafter, a heat treatment was performed on a hot plate at 100° C. for 10 minutes to form a hole transport layer (carrier transport layer).

Then, a photoactive layer formed of a single crystal perovskite thin film was formed on the hole transport layer in the same manner as that of Experimental Example 1.

Thereafter, the photoactive layer was transferred to a thermal evaporator to deposit LiF at a thickness of 1 nm or less by thermal evaporation so as to perform surface passivation, and then, C60 was deposited at a thickness of 12 nm through thermal evaporation, thereby forming a lower electron transport layer. Then, SnOx was deposited by a thermal evaporation or atomic layer deposition (ALD) process at a thickness of 10 nm to form an upper electron transport layer.

Silver (Ag) was thermally evaporated on the electron transport layer to manufacture a solar cell including a metal electrode.

Comparative Example 4

A solar cell was manufactured in the same manner as that of Experimental Example 3, except that a photoactive layer formed of a perovskite thin film was formed in the same manner as that of Comparative Example 1.

Experimental Example 4

A solar cell was manufactured in the same manner as that of Experimental Example 3, and a photoactive layer was formed in the same manner as that of Experimental Example 1 except for injecting nitrogen gas heated to 80° C. into a vacuum chamber.

Comparative Example 5

A solar cell was manufactured in the same manner as that of Experimental Example 3, and a photoactive layer was formed in the same manner as that of Experimental Example 1 except for injecting nitrogen gas heated to 20° C. into a vacuum chamber.

Experimental Example 5

A solar cell was manufactured in the same manner as that of Experimental Example 3, and a photoactive layer was formed in the same manner as that of Experimental Example 1 except for using a precursor solution further containing 1 mg/ml of potassium iodide (KI) as a passivation additive.

Experimental Example 6

A solar cell was manufactured in the same manner as that of Experimental Example 3, and a photoactive layer was formed in the same manner as that of Experimental Example 1 except for using a precursor solution further containing 1 mg of BASCN as a passivation additive.

Figure 10:
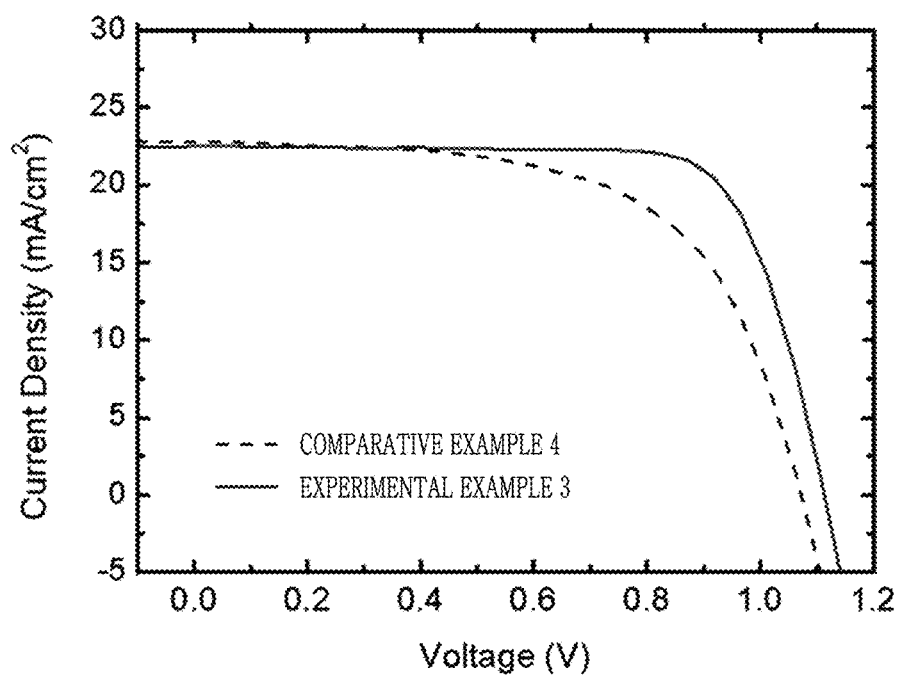
FIG. 10 is a voltage-current graph of solar cells manufactured according to Experimental Example 3 and Comparative Example 4.

FIG. 10 is a voltage-current graph of the solar cells manufactured according to Experimental Example 3 and Comparative Example 4.

TABLE 1

| | $V_{oc}$ [V] | $J_{sc}$ [mA cm$^{-2}$] | FF [%] | PCE [%] |
|---|---|---|---|---|
| Comparative Example 4 | 1.072 | 22.77 | 60.84 | 14.85 |
| Experimental Example 3 | 1.113 | 22.48 | 75.63 | 18.93 |

Referring to FIG. 10 and Table 1, it could be confirmed that a voltage-to-current density of the solar cell manufactured according to Experimental Example 3 was higher than a voltage-to-current density of the solar cell manufactured according to Comparative Example 4. Therefore, it could be confirmed that the efficiency of the solar cell manufactured according to Experimental Example 3 was 18.93%, whereas the efficiency of the solar cell manufactured according to Comparative Example 4 was 14.85%, which was low.

It could be confirmed that the efficiency of the solar cell of Experimental Example 3 was relatively higher than that of the solar cell of Comparative Example 4 because a trap density of the photoactive layer formed of the single crystal perovskite thin film of the solar cell according to Experimental Example 3 was lower than that of the photoactive layer formed of the polycrystalline perovskite thin film of the solar cell of Comparative Example 4.

Figure 11:
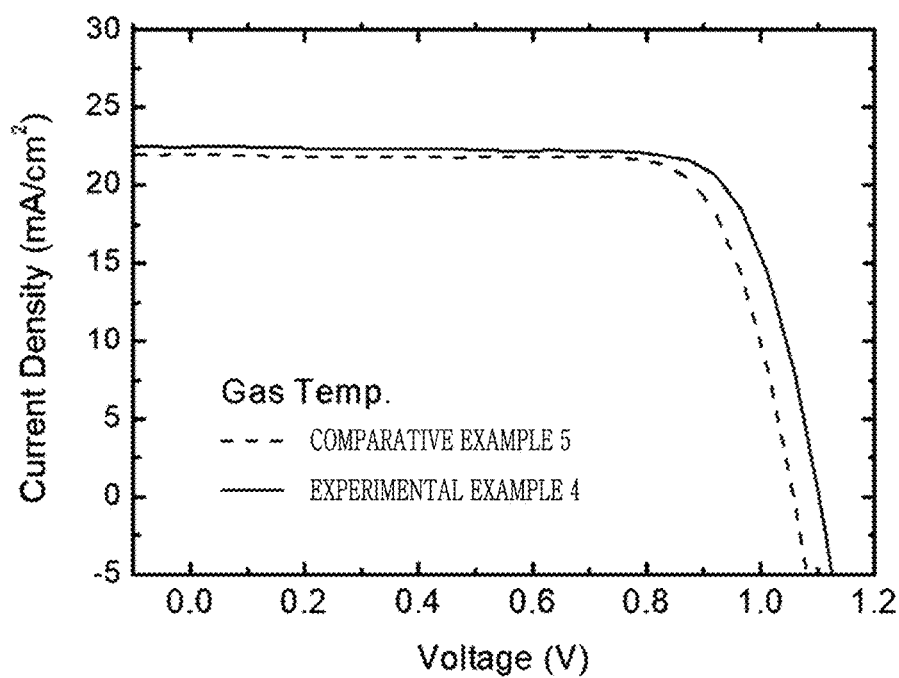
FIG. 11 is a graph showing efficiency of solar cells manufactured according to Experimental Example 4 and Comparative Example 5.

FIG. 11 is a graph showing efficiency of the solar cells manufactured according to Experimental Example 4 and Comparative Example 5.

TABLE 2

| | $V_{oc}$ [V] | $J_{sc}$ [mA cm$^{-2}$] | FF [%] | PCE [%] |
|---|---|---|---|---|
| Comparative Example 5 | 1.058 | 21.94 | 77.11 | 17.89 |
| Experimental Example 4 | 1.102 | 22.46 | 77.07 | 19.08 |

Referring to FIG. 11 and Table 2, it could be confirmed that a voltage-to-current density of the solar cell manufactured according to Experimental Example 4 was higher than a voltage-to-current density of the solar cell manufactured according to Comparative Example 5. Therefore, it could be confirmed that the efficiency of the solar cell manufactured according to Comparative Example 5 was 17.89%, which was low, whereas the efficiency of the solar cell manufactured according to Experimental Example 4 was 19.8%, which was high.

Figure 12:
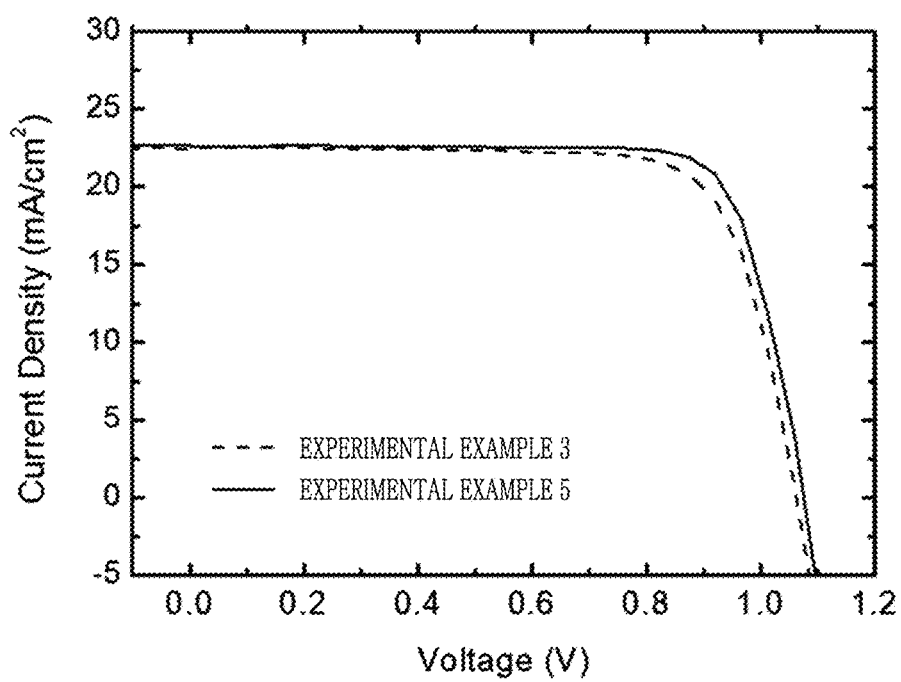
FIG. 12 is a graph showing efficiency of solar cells manufactured according to Experimental Examples 3 and 5.

FIG. 12 is a graph showing efficiency of the solar cells manufactured according to Experimental Examples 3 and 5.

TABLE 3

| | $V_{oc}$ [V] | $J_{sc}$ [mA cm$^{-2}$] | FF [%] | PCE [%] |
|---|---|---|---|---|
| Experimental Example 3 | 1.063 | 22.47 | 76.07 | 18.17 |
| Experimental Example 5 | 1.075 | 22.64 | 79.21 | 19.29 |

Referring to FIG. 12 and Table 3, it could be confirmed that the efficiency of the solar cell manufactured by adding potassium iodide (KI) to the precursor solution for passivation as in Experimental Example 5 was higher than that of the solar cell of Experimental Example 3 in which potassium iodide was not added. Therefore, it could be confirmed that the efficiency of the solar cell of Experimental Example 3 was 18.17%, whereas the efficiency of the solar cell of Experimental Example 5 was 19.29%, which was high.

Iodine and metal cations ($K^+$) of potassium may form ionic defects with uncoordinated anions. Since the perovskite photoactive layer generally has uncoordinated halogen ions and antisite defects, the metal cations ($K^+$) contained in the precursor solution may increase the efficiency by effectively passivating electron-rich defects and suppressing the oxidation reaction of halogen ions to reduce non-radiative recombination.

Figure 13:
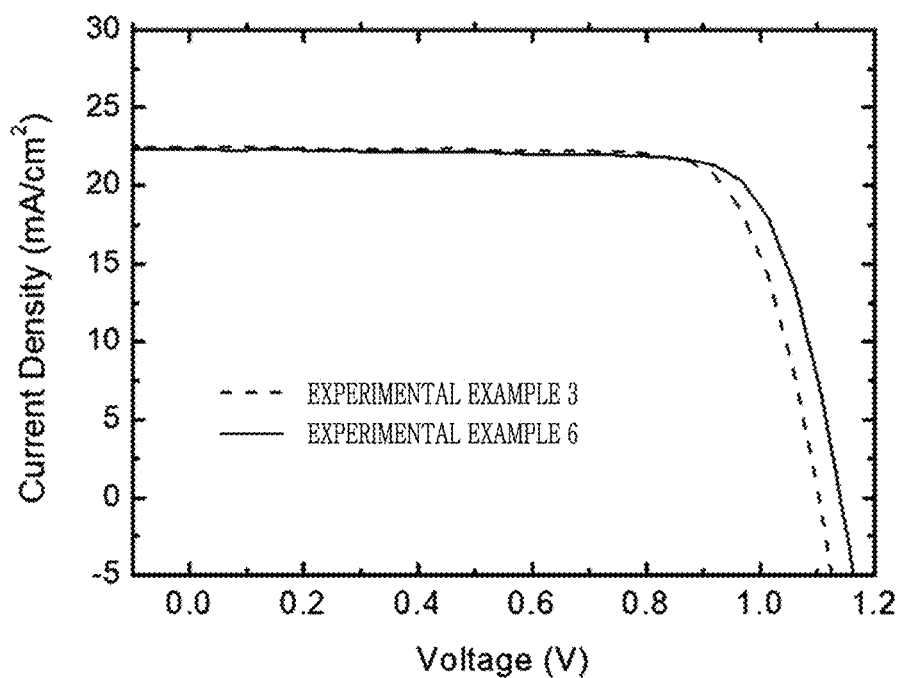
FIG. 13 is a graph showing efficiency of solar cells manufactured according to Experimental Examples 3 and 6.

FIG. 13 is a graph showing efficiency of the solar cells manufactured according to Experimental Examples 3 and 6.

TABLE 4

| | $V_{oc}$ [V] | $J_{sc}$ [mA cm$^{-2}$] | FF [%] | PCE [%] |
|---|---|---|---|---|
| Experimental Example 3 | 1.063 | 22.47 | 76.07 | 18.17 |
| Experimental Example 6 | 1.075 | 22.64 | 79.21 | 19.29 |

Referring to FIG. 13 and Table 4, it could be confirmed that a voltage-to-current density of the solar cell manufactured by adding benzylammonium thiocyanate (BASCN) to the precursor solution for passivation as in Experimental Example 6 was higher than that of the solar cell according to Experimental Example 3. Therefore, it could be confirmed that the efficiency of the solar cell according to Experimental Example 3 was 18.17%, whereas the efficiency of the solar cell according to Experimental Example 6 was increased to 19.29%.

Thiocyanate ($SCN^-$) of benzylammonium thiocyanate may passivate defects such as $Pb^{2+}$ in the perovskite photoactive layer, and at the same time, benzylammonium ($BA^+$) may form $BAPbI_3$. Therefore, the efficiency may be further improved by such a synergy effect.

Several types of defects may exist in the single crystal perovskite photoactive layer according to the present invention. These defects may lead to non-radiative charge carrier recombination, which may cause deterioration of the efficiency.

Therefore, when an additive effective in the passivation of the defects is introduced, crystallization of perovskite may be controlled, a band energy level may be optimized, the defects may be passivated, and a charge carrier mobility rate may be affected.

As set forth above, in the present invention, the efficiency of the solar cell may be improved by forming a photoactive layer using the single crystal perovskite thin film, and a solar cell having further improved efficiency may be manufactured by adding a passivation additive to a precursor solution.

Although the exemplary embodiments of the present invention have been described hereinabove, the present invention is not limited thereto, and various modifications may be made within the scope of the claims, the detailed description of the invention, and the accompanying drawings.

What is claimed is:

1. A method of forming single crystal perovskite, the method comprising:
    forming a preliminary thin film by applying a perovskite precursor solution containing an additive on a substrate;
    exposing the preliminary thin film to a vacuum state by transferring the preliminary thin film to a vacuum chamber, wherein the exposing of the preliminary thin film to the vacuum state is performed for 1 second to 10 minutes, wherein an internal pressure of the vacuum chamber is $1^{-1}$ to $3^{-3}$ torr; and
    switching the internal pressure of the vacuum chamber to an atmospheric pressure,
    an inert gas is heated at 25° C. to 300° C. and injected into the vacuum chamber,
    wherein the additive includes a substituted or unsubstituted C1 to C30 aliphatic ammonium salt, a substituted or unsubstituted C6 to C30 aromatic ammonium salt, a substituted or unsubstituted C1 to C30 aliphatic amine salt, a substituted or unsubstituted C6 to C30 aromatic amine salt, or a combination thereof,
    wherein:
    the substituted or unsubstituted C1 to C30 aliphatic ammonium salt or the substituted or unsubstituted C6 to C30 aromatic ammonium salt is any one of 2-chloroethylammonium (CIEA$^+$), ethane-1,2-diammonium (EDA$^{2+}$), 2-(methylthio)-ethylammonium (MTEA$^+$), n-propylammonium (n-PA$^+$), n-butylammonium (n-BA$^+$), iso-butylammonium (i-BA$^+$), tert-butylammonium (tBA$^+$), tetra-butylammonium (TBA$^+$), 5-ammonium valeric acid (5-AVA$^+$), n-hexyl trimethyl ammonium (HTAB$^+$), n-octylammonium (n-OA$^+$), n-dodecylammonium (n-DA$^+$), pentafluorophenylethylammonium (FEA$^+$), 4-tert-butyl-benzylammonium (tBBA$^+$), and 1-napthylmethylammonium (NMA$^+$),
    wherein:
    the perovskite precursor solution further contains a passivation additive, and
    the passivation additive has at least one functional group of a metal cation, —CN, —NH$_2$, —N$_3$, —Cl, —Br, —I, —F, —COOH, —POOH, —OH, —CF$_3$, —OCH$_3$—C=O, —S=O—SH, —NH, a benzyl group, an alkoxy group, and —CH$_3$, thereby forming a single crystal perovskite with a single crystal plane in a vertical direction.

2. The method of claim 1, wherein:
the substituted or unsubstituted C1 to C30 aliphatic amine salt or the substituted or unsubstituted C6 to C30 aromatic amine salt is S-benzyl-L-cysteine (SBLC$^+$).

3. The method of claim 1, wherein:
the inert gas is nitrogen or argon.

4. The method of claim 1, wherein:
the additive is injected in an amount of 0.001 wt % to 10 wt % with respect to the amount of the perovskite precursor solution.

5. The method of claim 1, wherein:
the passivation additive is benzylammonium thiocyanate (BASCN).

* * * * *